United States Patent [19]
Ishigaki

[11] Patent Number: 5,648,736
[45] Date of Patent: Jul. 15, 1997

[54] FREQUENCY CONVERTING CIRCUIT

[75] Inventor: Yukinobu Ishigaki, Miura, Japan

[73] Assignee: Victor Company of Japan, Ltd., Yokohama, Japan

[21] Appl. No.: 499,169

[22] Filed: Jul. 7, 1995

[30] Foreign Application Priority Data

| Jul. 8, 1994 | [JP] | Japan | 6-180758 |
| Aug. 8, 1994 | [JP] | Japan | 6-205955 |

[51] Int. Cl.⁶ .............................. H03C 1/60; H03K 7/00
[52] U.S. Cl. ................. 327/113; 327/129; 327/105; 327/356
[58] Field of Search .................. 327/113, 114, 327/117, 119, 124, 129, 105, 107, 116, 232, 356, 403, 407, 415

[56] References Cited

U.S. PATENT DOCUMENTS

| 3,641,442 | 2/1972 | Boucher | 307/14 |
| 4,710,890 | 12/1987 | Bailey | 327/107 |
| 4,942,310 | 7/1990 | Renggli et al. | 327/113 |
| 5,132,633 | 7/1992 | Wong et al. | 327/113 |
| 5,500,613 | 3/1996 | Gazsi | 327/129 |

FOREIGN PATENT DOCUMENTS

| 0 369 102 | 5/1990 | European Pat. Off. | H03C 1/00 |
| 94063 | 6/1969 | France | H03D 7/00 |
| 61-159809 | 7/1986 | Japan | H03C 1/60 |
| 61-179605 | 8/1986 | Japan | H03C 1/60 |

*Primary Examiner*—Timothy P. Callahan
*Assistant Examiner*—Terry L. Englund
*Attorney, Agent, or Firm*—Michael N. Meller

[57] ABSTRACT

A frequency converting circuit which requires no balance regulation, is usable in a wide frequency band and is suitable to be incorporated in an integrated circuit. A first input signal is supplied to an input terminal 1 and a phase division circuit 2 to produce two phase divided signals from the first input signal. A second input signal is supplied to an input terminal 4 of a switch signal generating circuit 5 which produces two switch signals from the second input signal. A first one of the two switch signals and the two phase divided signals are supplied to a first switch 3. Switch 3 selectively outputs one of the two phase divided signals responsive to the first one of the two switch signals. Another output of the first switch 3 is a signal obtained by inverting a phase of the one selected output signal of switch 3 by means of the phase invertor/ amplifier 6. The inverted switch signal of invertor/amplifier 6 is applied to a switch 7 which selectively outputs one of the output signals of this switch 3 and an inverted signal output from the phase invertor/amplifier 6, responsive to the second one of the two switch signals.

16 Claims, 13 Drawing Sheets

FREQUENCY CONVERTING CIRCUIT

BACKGROUND OF THE INVENTION

1. Field of the Invention:

The present invention relates to an improvement of a frequency converting circuit employing a phase shift type single sideband signal generation method and is suitable to be formed as an integrated circuit.

2. Description of the Related Art:

It has been well known, as a frequency converting circuit or, in more general definition, a device for obtaining a single sideband signal, to generate a single sideband signal by selectively separating, by filters, single sideband signals of a double sideband signal obtained by suppressing a carrier by means of a multiplier, balanced modulator or a double-balanced mixer or to generate a phase shift type single sideband signal by supplying a pair of a carrier and a signal to a balanced modulator and another pair of a carrier and a signal whose phases are different from those of the first pair by 90 degrees to another balanced modulator and adding an output of one of the balanced modulators to or subtracting the output of the one balanced modulator from an output of the other balanced modulator so that filters are basically eliminated, as disclosed in, for example, B. P. Lathi, "Signals, Systems and Communication", 1965, John Wiley & Sons, B. P. Lathi, "Random Signals and Communication Theory", 1968, John Wiley & Sons and B. P. Lathi, "Communication Systems", 1968, McGraw-Hill.

When a frequency conversion is performed by the frequency converting circuit mentioned above by using a first signal frequency f1 and a second signal frequency f2, a sum f1+f2 or a difference f1−f2 can be obtained easily by a multiplier and a filter if the both frequencies are relatively high and the use of the filter Is allowed. However, when the first frequency is very high and the second frequency is very low, the selective separation by means of the filter is substantially impossible.

The phase shift type single sideband signal generator circuit is used in order to solve the above problem. In this circuit, a filter is basically unnecessary although a simple filter is used practically and, if characteristics and adjustments of the circuit are complete, the desired frequency, f1+f2 or f1−f2, can be selected, so that f1 is suppressed.

However, in a practical circuit, the balanced modulators become easily unbalanced and an error of mixing levels is easily caused in an adder or a subtracter circuit. Therefore, when, for example, f1+f2 is to be selected, it is extremely critical to separate the frequency by a filter, since f1 residing in a proximity of the suppressed carrier and harmonics of the f1−f2 component are undesirably mixed into and are difficult to be removed.

Particularly, when the frequency converting circuit is to be provided as an Integrated circuit, respective balance adjustments must be performed externally of the integrated circuit, for which the number of pins of the integrated circuit must be increased. Thus, the provision of the frequency converting circuit using the phase shift type single sideband signal generating circuit as an integrated circuit is not beneficial.

Now a conventional circuit will be described with reference to FIGS. 11 and 12.

FIG. 11 is a block diagram of a conventional frequency converting circuit and FIG. 12 shows signal waveforms at various points in the frequency converting circuit.

In FIG. 11, it is assumed that an input signal A1cosPt is inputted to an input terminal 101 and an input signal A2cosCt is inputted to an input terminal 105. These input signals are supplied to a $\pi/2$ phase shifter circuit 103 and a $\pi/2$ phase shifter circuit 106, respectively. An output of the $\pi/2$ phase shifter 103 becomes A1sinPt and an output of the $\pi/2$ phase shifter circuit 106 becomes A2sinCt. In a multiplier circuit (or balanced modulator) 102, the input signal A1cosPt is multiplied with the input signal A2cosCt and, In a multiplier circuit (or balanced modulator) 104, the output signal A1sinPt of the $\pi/2$ phase shifter circuit 103 is multiplied with the output signal A2sinCt of the $\pi/2$ phase shifter circuit 106, resulting in the following outputs of the respective multiplier circuits 102 and 104:

$$A1\cos Pt \cdot A 2\cos Ct = (A1A2/2)\{\cos (P-C)t + \cos (P+C)t\} \quad (1)$$

$$A1\sin Pt \cdot A 2\sin Ct = (A1A2/2)\{\cos (P-C)t - \cos (P+C)t\} \quad (2)$$

Therefore, an arithmetic operation circuit 107 provides A1A2cos(P−C)t as the output when an addition is performed, or A1A2cos(P+C)t as the output when a subtraction is performed.

Although the signal input to the input terminal 105 is shown as having a rectangular waveform in FIG. 12, the waveform of the input signal is not limited thereto. In a practical circuit, the multiplier circuits 102 and 104 are balanced modulators (double balanced modulators or double balanced mixers) which operate to switch the signal at the input terminal 101 with the signal at the input terminal 105.

In this example, the input signals have rectangular waveforms.

In FIG. 11, the input signal A inputted to the input terminal 101 is supplied to the multiplier 102 and the $\pi/2$ phase shifter circuit 103 and the input signal C inputted to the input terminal 105 is supplied to the multiplier 102 and the $\pi/2$ phase shifter circuit 106, as mentioned previously.

In FIG. 12, the multiplier 102 multiplies the input signal A by the input signal C and outputs an output signal E and the multiplier 104 multiplies an output signal B of the $\pi/2$ phase shifter circuit 103 by an output signal D of the $\pi/2$ phase shifter 106 and outputs an output signal F.

The arithmetic operation circuit 107 is an adder circuit which adds the output signal E to the output signal F, resulting in a frequency difference as mentioned previously which is outputted as an output signal G. Although the waveform of the output signal G is not exact rectangular, a fundamental wave component signal H is outputted at an output terminal 110 through a low-pass filter (LPF) 109.

The fundamental frequency of the input signal C is 4 times the frequency of the input signal A and the frequency of the output signal H is 3 times the frequency of the input signal A, and this fact confirms a result of calculation of 4 (frequency of input signal C)−1 (frequency of input signal A)=3 (frequency of output signal H).

The waveforms shown in FIG. 12 are ideal. In such circuit construction, when the balance in the balanced modulators 102 and 104 is off even slightly, the waveforms of the output signals E and F become different from those shown in FIG. 12 and the output signal G of the arithmetic operation circuit 107 becomes different from that shown in FIG. 12 when the mixing balance is broken even slightly.

In view of these, it has been desired that a frequency converting circuit which can be used in a wide frequency band from low to high frequencies without requiring a balance adjustment and Is suitable to be constructed as an integrated circuit based on the phase shift type single sideband signal generation method.

SUMMARY OF THE INVENTION

Accordingly, an object of the present invention is to provide a frequency converting circuit which can be used in a wide frequency band from low frequency to high frequency without requiring balance adjustments and is suitable to be constructed as an integrated circuit based on the phase shift type single sideband signal generation method.

In order to achieve the above object, a frequency converting circuit according to the present invention for converting a frequency of a first input signal into another frequency by a second input signal is featured by comprising a phase division device for shifting a phase of the first input signal and outputting a plurality of channel signals having different phases, a switch signal generating device for generating a corresponding number of switch signals to the number of the channel signals from the second input signal, a first switch device composed of a switch for switching two of the plurality of the channel signals or two channel signals generated from the plurality of the channel signals and outputting one of the two channel signals in response to one of the switch signals or composed of a plurality of switches connected in parallel and series configurations and a second switch device for outputting one of an output signal of the first switch device and a signal obtained by inverting a phase of the output signal of the first switch device in response to one of the switch signals.

In another aspect of the present invention, a frequency converting circuit according to the present invention for converting a frequency of a first input signal into another frequency by a second input signal is featured by comprising a phase division device for shifting a phase of the first input signal and outputting a plurality of channel signals having different phases, a switch signal generating device for generating a corresponding number of switch signals to the number of the channel signals from the second input signal, a first switch device for outputting one channel signal by switching the plurality of the channel signals in response to one of the switch signals and a second switch device for outputting one of an output signal of the first switch device and a signal obtained by inverting a phase of the output signal of the first switch device in response to another one of the switch signals.

In another aspect of the present invention, a frequency converting circuit according to the present invention for obtaining a sum or a difference of a first input signal and a second input signal is featured by comprising a phase division device for dividing a phase of the first input signal to a plurality of phases to obtain a plurality of channel signals having different phases and outputting the plurality of the channel signals having different phases, a switch signal generating device for generating switch signals having different phases corresponding in number to the channel signals from the second input signal and a switch device composed of a plurality of switches responsive to one of the plurality of the channel signals having different phases corresponding in number to the channel signals and one of the plurality of the switch signals for outputting the one channel signal by the one switch signal, the switch device outputting the output of the plurality of the switches at one terminal thereof.

DETAILED DESCRIPTION OF THE PREFERRED EMBODIMENTS

Figure 1:
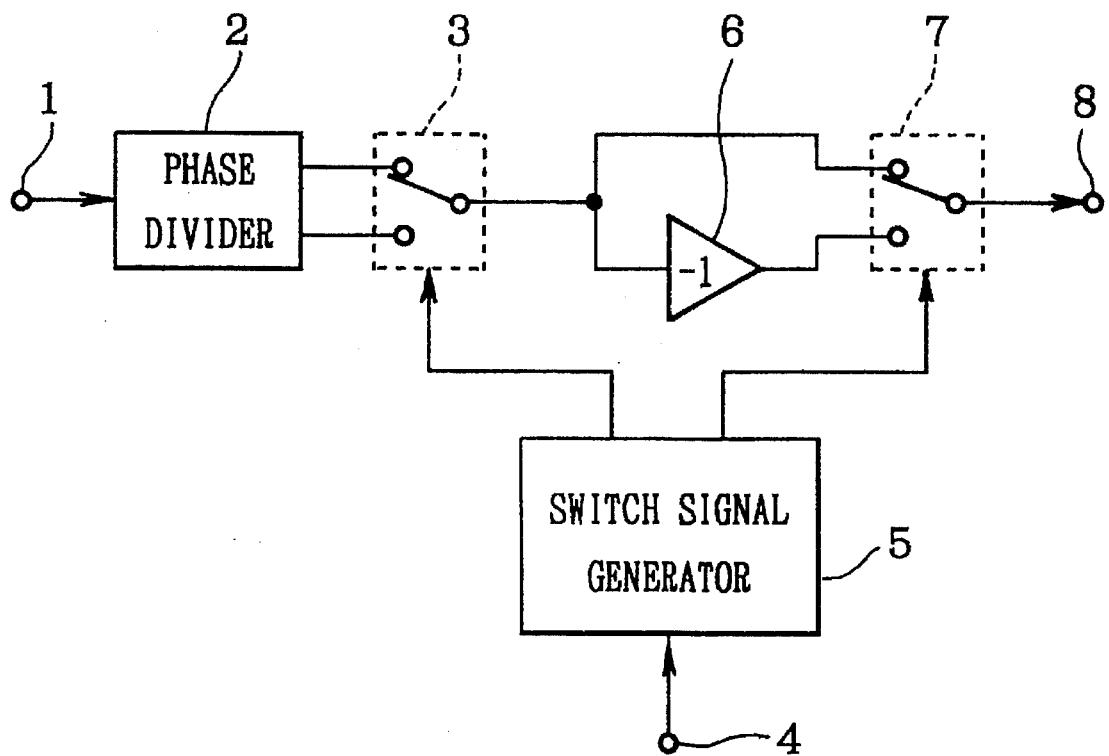
FIG. 1 is a block circuit diagram of a basic system of a frequency converting circuit according to the present invention.

A frequency converting circuit according to the present invention will be described in detail with reference to the accompanying drawings, in which FIG. 1 is a block circuit diagram of an example of a basic system of frequency converting circuit of the present invention.

First, a basic operation of the circuit shown in FIG. 1 will be described. A first input signal is supplied to an input terminal 1, and a phase division circuit 2 divides (shifts) a phase of the first input signal and outputs a plurality of phase divided signals (channel signals having their phases shifted from each other) which are supplied to a switch 3.

A second input signal is supplied to an input terminal 4, and a switch signal generating circuit 5 generates a plurality of switch signals from the second input signal.

Assuming that the phase division circuit 2 outputs two channel signals and the switch signal generating circuit 5 outputs two switch signals, then the two channel signals and one of the switch signals are supplied to the switch 3 and one of the channel signals is outputted from the switch 3 in response to the switch signal.

The output of the switch 3, a signal which is the output signal of the switch 3 inverted by a phase inverting amplifier 6 having gain of 1 and the other switch signal are supplied to a switch 7. In response to the other switch signal, switch 7 outputs to an output terminal 8 one of the output of the switch 3 and the signal which is the output signal of the switch 3 inverted by the phase inverting amplifier 6. The output of switch 7, a signal which corresponds to a frequency converted first input signal in response to the second input signal, is passed through a simple low-pass filter which is not shown.

The phase division circuit 2 outputs a plurality (in this case, two) of channel signals whose phases are shifted into different values from that of the first input signal, and each of which is within π rad.

Figure 2:
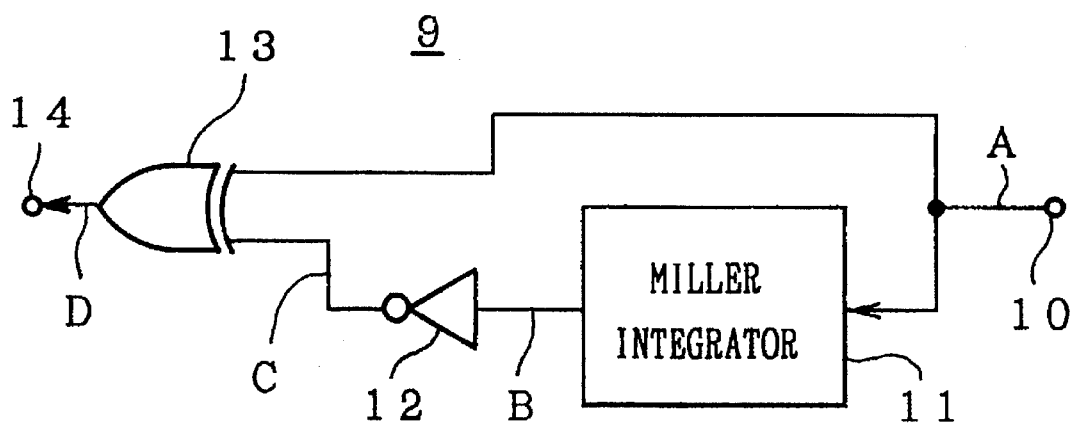
FIG. 2 is a block circuit diagram of an example of a frequency doubler.
Figure 3:
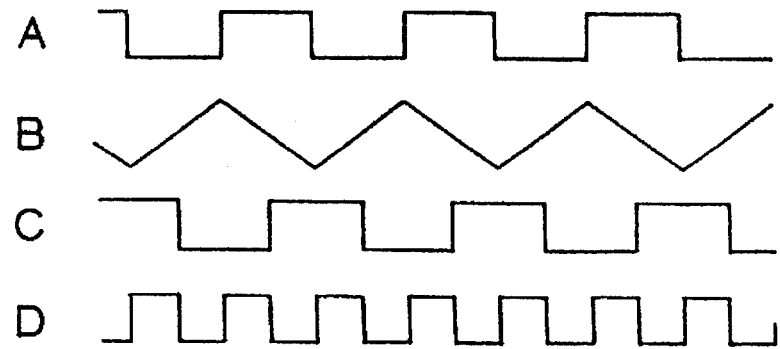
FIG. 3 shows waveforms useful to understand an operation of the circuit shown in FIG. 2.

The switch signal generating circuit 5 comprises, for example, a frequency doubler. FIG. 2 is a block circuit diagram of an example of the frequency doubler and FIG. 3 shows signal waveforms at various points thereof.

The frequency doubler 9 is constructed with a Miller integrator circuit 11 whose duty ratio is stable with respect to a variation of an input signal frequency, an inverter 12 and an EX-OR gate 13.

Figure 4:
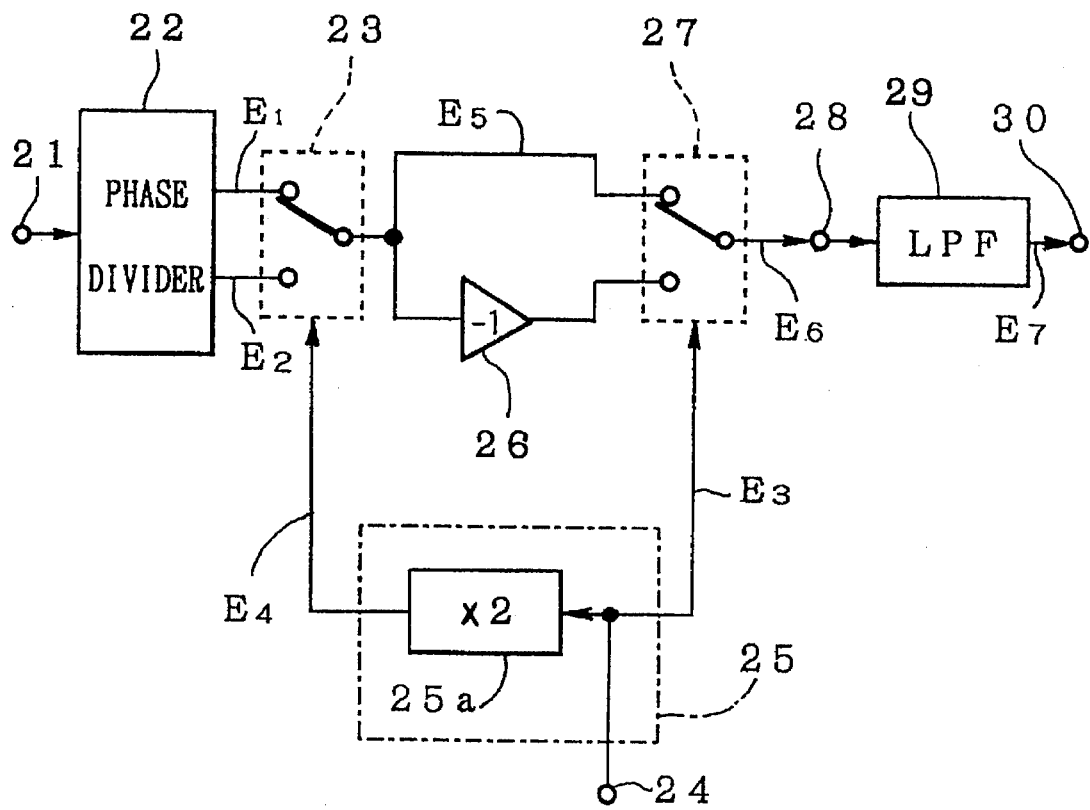
FIG. 4 is a block circuit diagram of a first embodiment of a frequency converting circuit according to the present invention.
Figure 5:
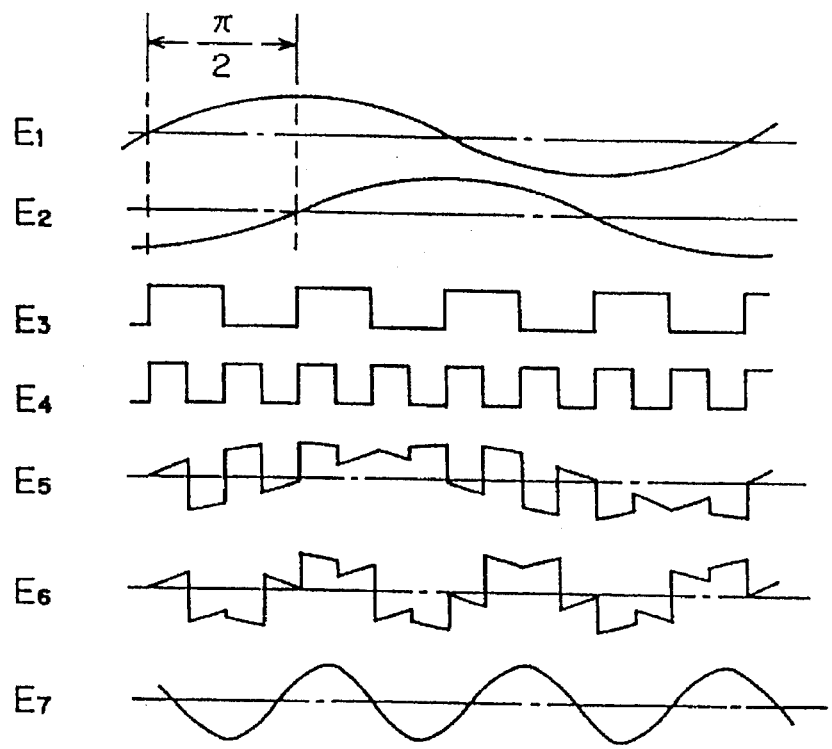
FIG. 5 shows waveforms useful to understand an operation of the circuit shown in FIG. 4.

FIG. 4 is a block circuit diagram showing a first embodiment of the frequency converting circuit according to the present invention and FIG. 5 shows signal waveforms at various points of the frequency converting circuit shown in FIG. 4.

In FIG. 4, a first input signal E1 supplied to an input terminal 21 is supplied to a phase dividing circuit 22 which outputs the channel signal E1 and a channel signal E2 whose phase is shifted with respect to the channel signal E1 by π/2 rad. The channel signals E1 and E2 are supplied to a switch 23.

A second input signal E3 supplied from an input terminal 24 is supplied to a switch signal generating circuit 25 which outputs the second input signal E3 as a switch signal E3, and a switch signal E4 obtained by doubling the frequency of the second input signal E3 by a frequency doubler 25a. The switch signals E3 and E4 are supplied to a control terminal of a switch 27 (second switch group) respectively and a control terminal of the switch 23 (first switch group). In this case, duty ratios of the switch signals E3 and E4 are 50%, respectively.

The switch 23 switches between the channel signals E1 and E2 responsive to the switch signal E4 and outputs an output signal E5 which is one of the channel signals E1 and E2. In this embodiment, the channel signal E1 is outputted from the switch 23 when the switch signal E4 is high level being outputted from the switch signal generating circuit 25 and the channel signal E2 is outputted when the switch signal E4 is low level being outputted from the switch signal generating circuit 25.

The signal E5 is supplied to the switch 27 and a phase inverter amplifier 26 having gain of 1. An output of the phase inverter amplifier 26, which is the signal E5 whose phase is inverted, is supplied to the switch 27.

The switch 27 switches between the signal E5 and the phase inverted signal E5 responsive to the switch signal E3 and outputs an output signal E6 which is one of the signal E5 and the inverted signal. In this embodiment, the signal E5 is outputted from the switch 27 when the switch signal E3 is high level being outputted from the switch signal generating circuit 25 and the inverted signal is outputted when the switch signal E3 is low level being outputted from the switch signal generating circuit 25.

The signal E6 is passed through a simple low-pass filter (LPF) 29, resulting in a signal E7 at a final output terminal 30, which has a substantially ideal sinusoidal waveform and a frequency which is a difference between the first and second input signals.

Next, a second embodiment of the frequency converting circuit according to the present invention will be described.

Figure 6:
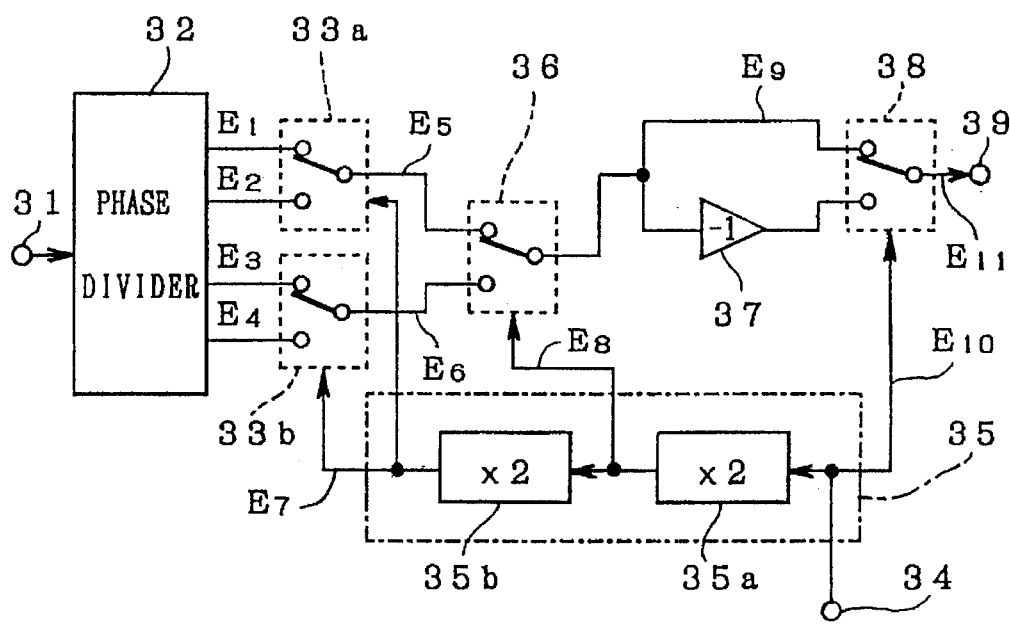
FIG. 6 is a block circuit diagram of a second embodiment of a frequency converting circuit according to the present invention.
Figure 7:
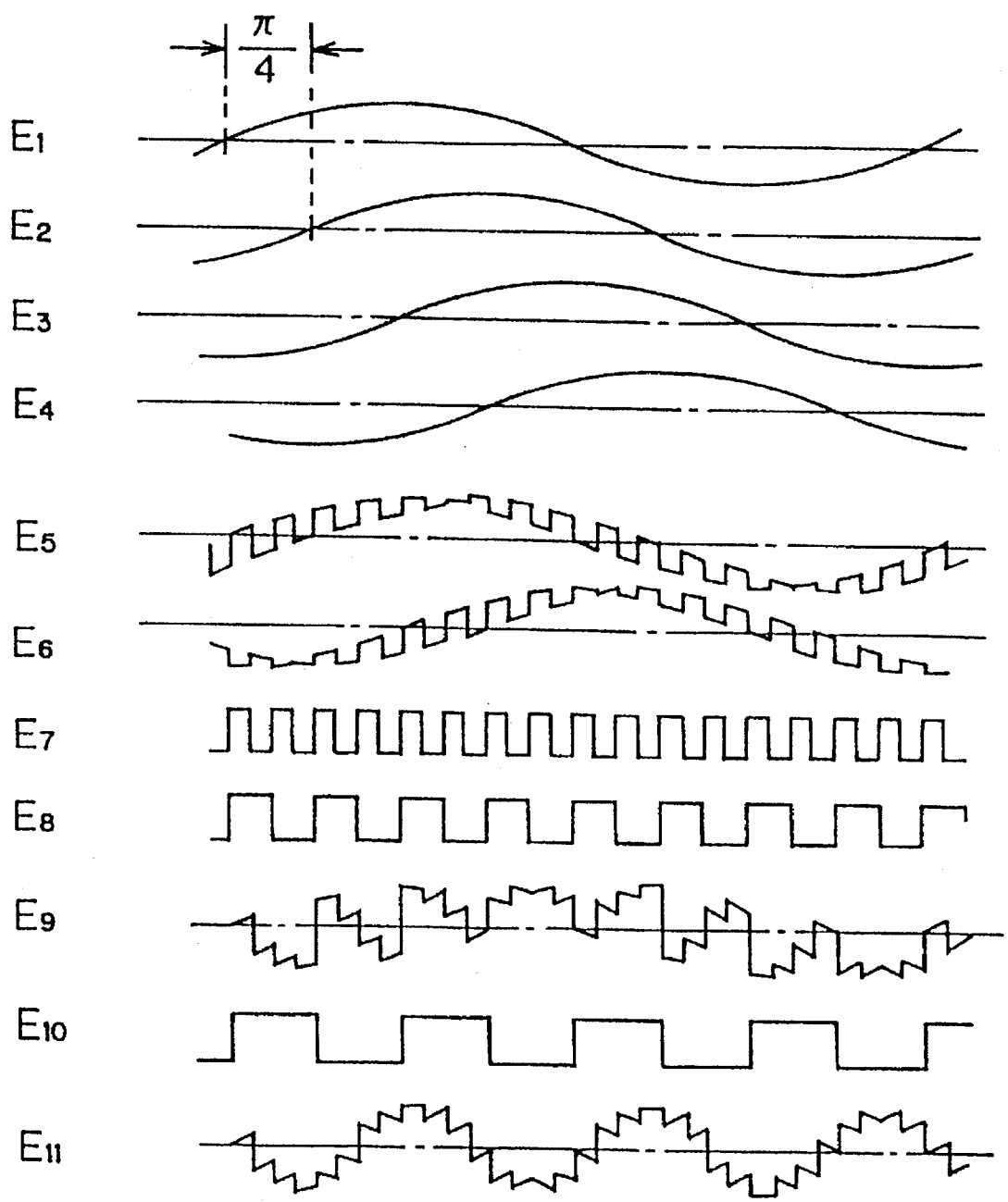
FIG. 7 shows waveforms useful to understand an operation of the circuit shown in FIG. 6.

FIG. 6 is a block circuit diagram showing the second embodiment of the frequency converting circuit according to the present invention and FIG. 7 shows signal waveforms at various points of the frequency converting circuit shown in FIG. 6.

In FIG. 6, a first input signal E1 supplied to an input terminal 31 is supplied to a phase dividing (shifting) circuit 32 which outputs a channel signal E1, a channel signal E2 whose phase is shifted from that of the channel signal E1 by π/4 rad., a channel signal E3 whose phase is shifted from that of the channel signal E2 by π/4 rad. and a channel signal E4 whose phase is shifted from that of the channel signal E3 by π/4 rad. The channel signals E1 and E2 are supplied to a switch 33a and the channel signals E3 and E4 are supplied to a switch 33b.

A second input signal E10 supplied from an input terminal 34 is supplied to a switch signal generating circuit 35 which outputs a switch signal E10 which is same as the second input signal E10, a switch signal E8 obtained by doubling the frequency of the second input signal E10 by a frequency doubler 35a and a switch signal E7 obtained by doubling the frequency of the switch signal E8 by a frequency doubler 35b. The switch signals E10, E8 and E7 are respectively supplied to a control terminal of a switch 38 (second switch group), a control terminal of another switch 36 (first switch of the second switch group) and the switches 33a and 33b (first and second switches of the third switch group).

The switch 33a switches between the channel signals E1 and E2 responsive to the switch signal E7 and outputs an output signal E5 which is one of the channel signals E1 and E2 and supplied to the switch 36.

The switch 33b switches between the channel signals E3 and E4 responsive to the switch signal E7 and outputs an output signal E5 which is one of the channel signals E3 and E4 and supplied to the switch 36.

The switch 36 switches between the output signals E5 and E6, which are respectively outputted from the switches 33a and 33b, responsive to the switch signal E8 and outputs an output signal E9 which is one of the channel signals E5 and E6.

The signal E9 is supplied to the switch 38 and a phase inverter amplifier 37 having gain of 1. An output of the phase inverter amplifier 37, which is the signal E9 whose phase is inverted, is supplied to the switch 38.

The switch 38 switches between the signal E9 and the phase inverted signal E9 responsive to the switch signal E10 and outputs an output signal E11. The output E11 is one of the signals E9 and the inverted signal E9 which is output to terminal 39. The signal E9 or the inverted signal Is passed through a simple low-pass filter (not shown), resulting In a signal which has a substantially ideal sinusoidal waveform and a frequency which is a difference between the first and second input signals.

The number of channels of the circuit shown in FIG. 6 is larger than that of the circuit shown in FIG. 4 and the signal waveform of the output frequency-converted signal E11 shown in FIG.7 is finer than that of the signal E6 shown in FIG. 5. Therefore, filtering characteristics of the low-pass filter to be used is not required to be sharp and thus it is possible to obtain an acceptable waveform even with a simple form of low-pass filter.

When the circuit shown in FIG. 6 is modified as such that the channel signals E1 and E3 are supplied to the switch 33a and the channel signals E2 and E4 are supplied to the switch 33b, the waveform of the output signal E11 at the output terminal 39 may be slightly different from that shown in FIG. 7. However, substantially the same waveform can be obtained by passing the signal E11 through a simple low-pass filter.

Further, when the circuit shown in FIG. 4 or 6 is modified such that the signals supplied to respective contacts of the switch 23 or of the switches 33a and 33b are reversed, a frequency which is a sum of the first and second input signals is obtained. That is, for example, in the circuit shown in FIG. 4, the sum frequency is obtained when the signal E2 is outputted from the switch 23 when the switch signal E4 is outputted from the switch signal generating circuit 25 and the signal E1 is outputted when the switch signal E4 is not outputted from the switch signal generating circuit 25.

Representing the number of channels as $2^n$, the switch signal generating circuit generates a total of $2^n$ switch signals (when N=the number of channels), which include:

one (1) unit of switch signal having a fundamental frequency equal to that of the second input signal;

one ($2^0=1$) unit of first switch signal having a frequency twice the fundamental frequency of the second input signal;

two ($2_1=2$) units of second switch signals, each having a frequency twice the fundamental frequency of the first switch signal, . . . ; and $2^{m-1}$ units of m-th switch signals, each having a frequency twice the fundamental frequency of a (m−1)th switch signal, that is, $2^m$ times the fundamental frequency of the second input signal.

When the number of channel signals generated by the phase dividing circuit is further increased to 8 or even 16, the number of the switch signals and the number of switches are increased correspondingly.

In a case where the number of channels is $2^3=8$, for example, there are provided first to fourth switch groups connected in tandem in succession in this order. These first to fourth switch groups are arranged as such that the first switch group includes $2_2=4$ switches (1st to 4th switches) laid in a first column, the second switch group includes $2^1=2$ 2 switches (1st and 2nd switches) laid in a second column, the third switch group includes $2^0=1$ switch and fourth switch group includes one additional switch. In the above, n is a natural number; and m is an ordinal number of the switch signals except for the switch signal having the fundamental frequency.

Respective outputs from the 1st and 2nd switches of the first switch group are fed respectively to 2 contacts of the 1st switch of the second switch group, respective outputs from the 3rd and 4th switches of the first switch group are fed respectively to 2 contacts of the 2nd switch of the second switch group, respective outputs from the 1st and 2nd switches of the second switch group are fed respectively to 2 contacts of the switch of the third switch group. Further, an output from the switch of the third switch group and an inverted signal thereof are respectively supplied to two contacts of the additional switch of the fourth switch group.

That is, a total of 8 switches are used for the 8 channels. For a larger number of channels, the same consideration is applied and the same number of switches as that of the channels are used.

Figure 8:
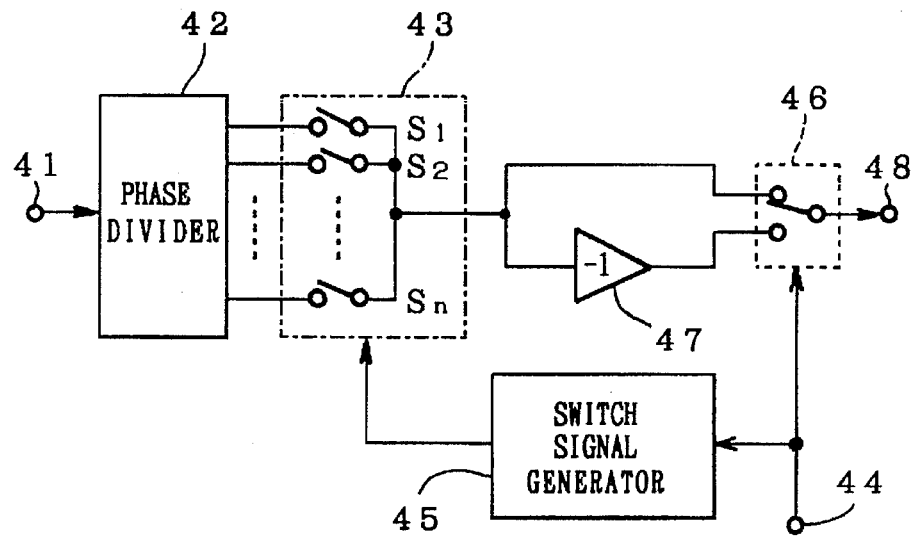
FIG. 8 is a block circuit diagram of another example of the basic system of a frequency converting circuit according to the present invention.

FIG. 8 shows a block circuit diagram of another example of a basic system of the frequency converting circuit according to the present invention.

Describing the construction of the circuit shown in FIG. 8, a first input signal is supplied to an input terminal 41, and a phase dividing (shifting) circuit 42 outputs N units of phase divided signals (channel signals) including the first input signal, the N units of phase divided signals have phases different from each other, where N is a natural number not smaller than 2. The total of N channel signals are supplied to inputs of switches S1, S2, . . . , and Sn of a switch circuit 43, of which outputs are connected commonly.

On the other band, a second input signal supplied through an input terminal 44, is supplied to a switch circuit 46 and to a switch signal generating circuit 45 which outputs N units of switch signals(shown only as a single line for clarity) having phases different from that of the second input signal, which are supplied to the switch circuit 43 as switch signals for the respective N switches S1, S2, . . and Sn.

An output of the switch circuit 43 is supplied to one contact of a switch circuit 46 and a signal obtained by inverting the output of the switch circuit 43 is also supplied to another contact of the switch circuit 46 which switches between the two signals (switch contacts), in response to the second input signal as a switch signal to output one of them at an output terminal 48. By passing the output from the output terminal 48 through a simple low-pass filter which is not shown, a signal is obtained, which is the frequency converted first input signal converted in response to the second input signal.

A third embodiment of the present invention which is based on the system shown in FIG. 8 will be described with reference to FIG. 9 which is a block circuit diagram thereof and FIG. 10 which shows signal waveforms at various portions of the circuit.

Figure 9:
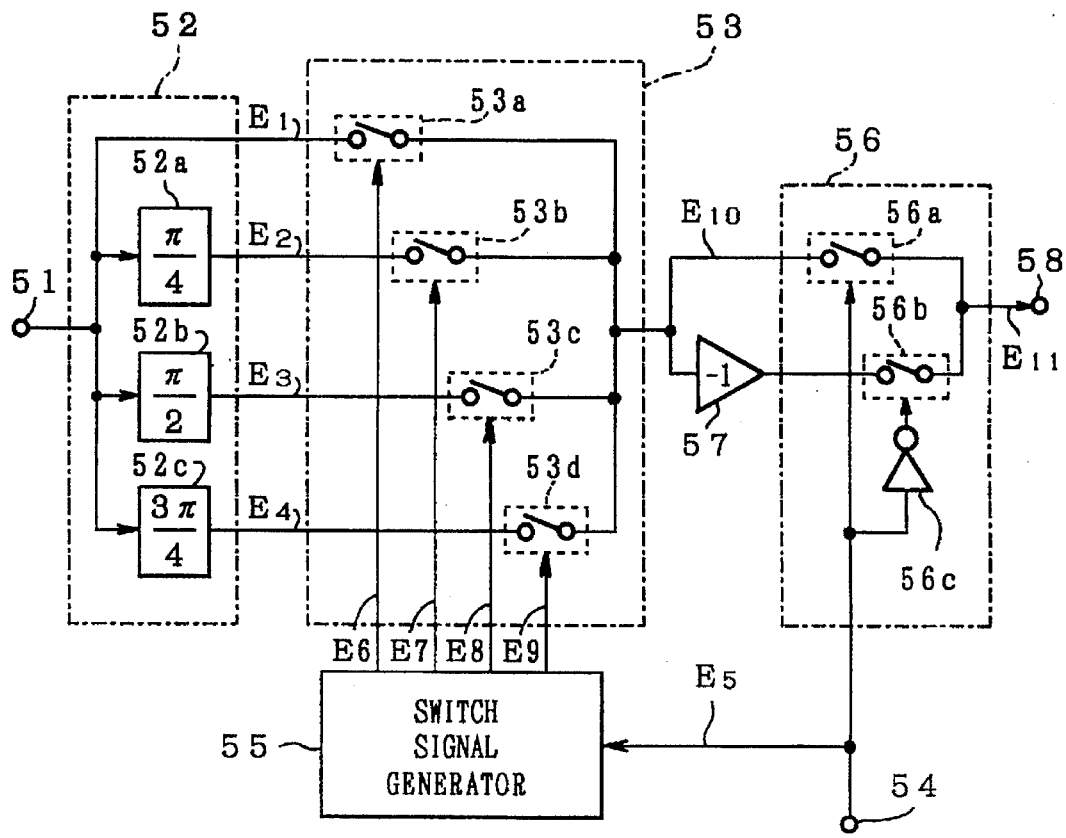
FIG. 9 is a block circuit diagram of a third embodiment of a frequency converting circuit according to the present invention.

In FIG. 9, a phase dividing circuit 52 receives a first input signal E1 through an input terminal 51, and outputs channel signals E1 through E4, of which phases are shifted respectively by $\pi/4$ (rad), $\pi/2$, $3\pi/4$ with respect to a phase of the channel signal E1 (the first input signal E1). These phase shifts are caused respectively by a $\pi/4$ phase shifter 52a, a $\pi/2$ phase shifter 52b and a $3\pi/4$ phase shifter 52c, which are included in the phase dividing circuit 52. In other words, the channel signals E1 through E4 are phase shifted in succession by $\pi/4$ each.

Thus outputted channel signals E1 to E4 are supplied to switches 53a to 53d of a switch circuit 53, respectively. In this case, the number of channels is 4.

A second input signal E5 supplied from an input terminal 54 is supplied to a switch signal generating circuit 55 and to a switch circuit 56.

The switch signal generating circuit 55 outputs switch signals E6 to E9 which are supplied to the switches 53a to 53d, respectively. Outputs of the switches 53a to 53d are connected commonly and thus an output signal E10 is obtained at an output of the switch circuit 53.

In this case, the switch signal generating circuit 55 generates four switch signals whose phases are different from each other and whose duty ratios are 25% each, that is, these signals are present (high) for a period corresponding to a phase of $\pi/4$ radian which is a period corresponding to $\pi$ rad. of the second input signal E5 divided by the number of channels, i.e., 4. The period of each switch signal is a half of the period of the second input signal.

When the switch signal generating circuit 55 is constructed with, for example, a Miller circuit and various gate circuits, etc., the duty ratio of each switch signal generated is stable and the frequency of the frequency converted output signal Is not deteriorated in its waveform even if the frequency of the input signal for frequency conversion varies.

The output signal E10 and a signal obtained by inverting the output signal E10 by the phase Inverter amplifier 57 are supplied to the switch circuit 56.

In the switch circuit 56, the output signal E10 is supplied to a switch 56a and the output signal of the inverter 57 is supplied to a switch 56b.

The second input signal is supplied to the switch 56a as a switch control signal and a signal obtained by inverting the second input signal by an inverter 56c is supplied to the switch 56b as a switch control signal.

Outputs of the switches 56a and 56b are connected commonly and an output signal E11 thereof is obtained at an output terminal 58.

The output signal E11 is passed through a simple low-pass filter which is not shown, resulting in a signal having a frequency which is a difference between the fundamental frequencies of the first and second input signals.

The switch circuit 56 may be replaced with switch circuit 46 shown in FIG. 8.

Figure 10:
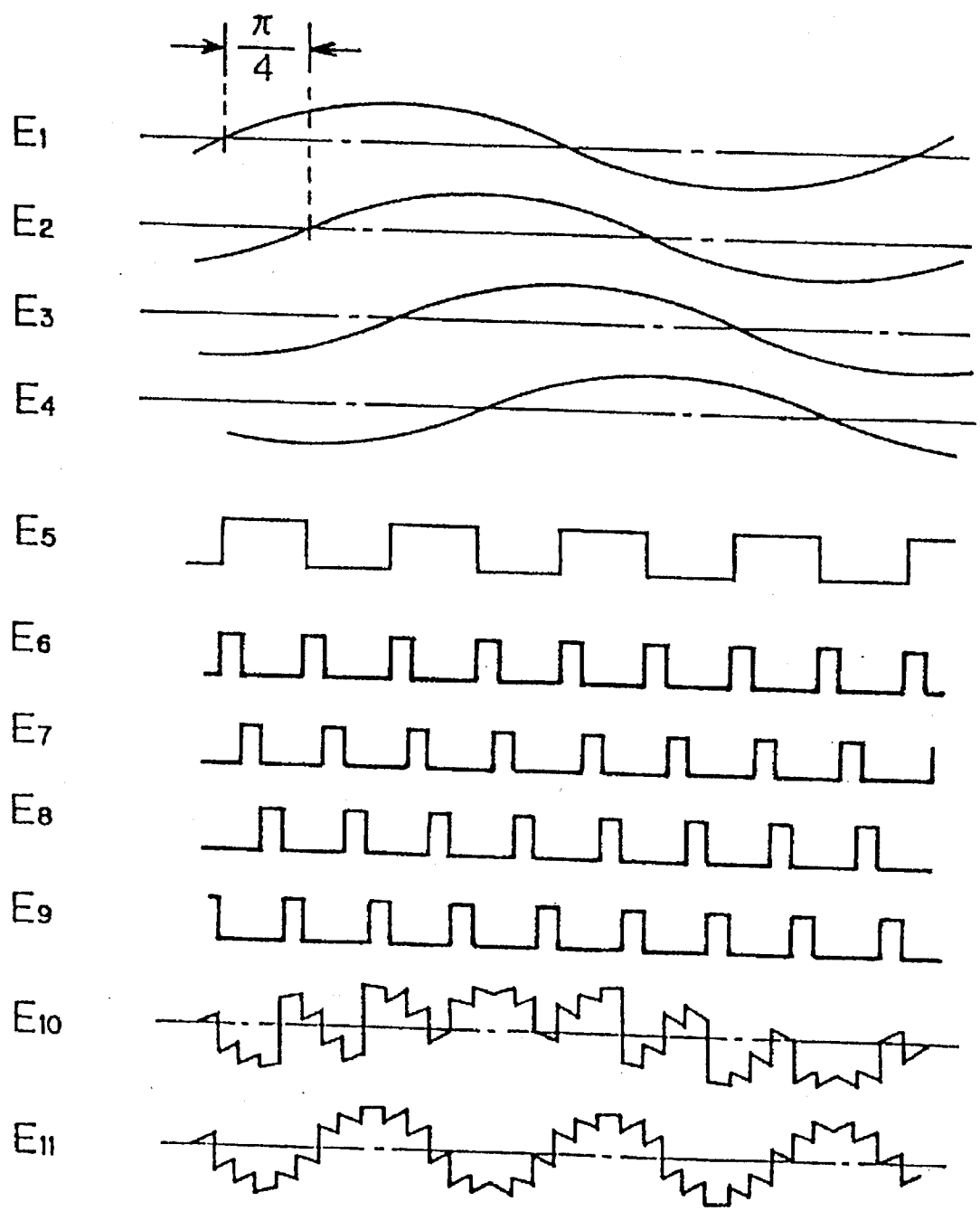
FIG. 10 shows waveforms useful to understand an operation of the circuit shown in FIG. 9.
Figure 11:
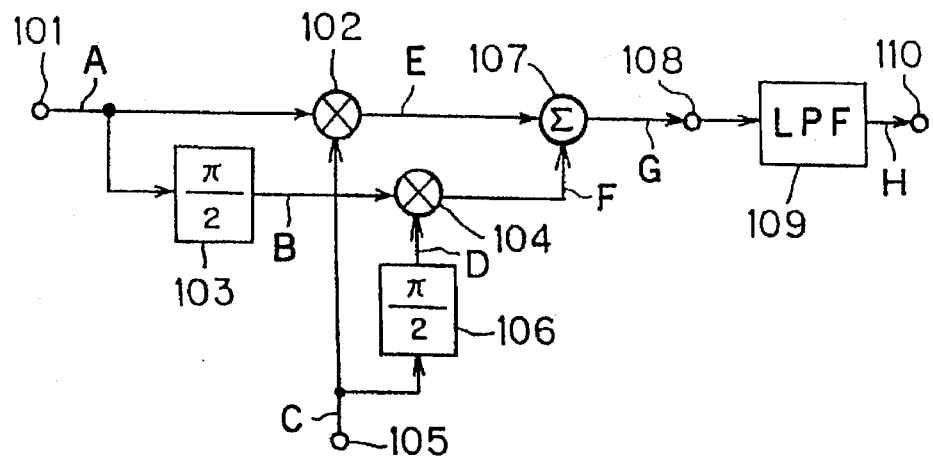
FIG. 11 is a block circuit diagram of a conventional frequency converting circuit.

Further, when the circuit shown in FIG. 9 is modified such that the channel signals E2 and E3 are supplied to the switches 53c and 53b, respectively, the waveform of the output signal E11 at the output terminal 58 may be slightly different from that shown in FIG. 10. However, substantially the same waveform can be obtained by passing the signal E11 through a simple low-pass filter.

In a case where a sum of the two input signals is to be obtained by the circuit shown in FIG. 9, the latter circuit may be modified such that the channel signals E1, E2, E3 and E4 are supplied to the switches 53d, 53c, 53b and 53a, respectively, or the switch signals E6, E7, E8 and E9 are supplied to the switches 53d, 53c, 53b and 53a, respectively.

Figure 12:
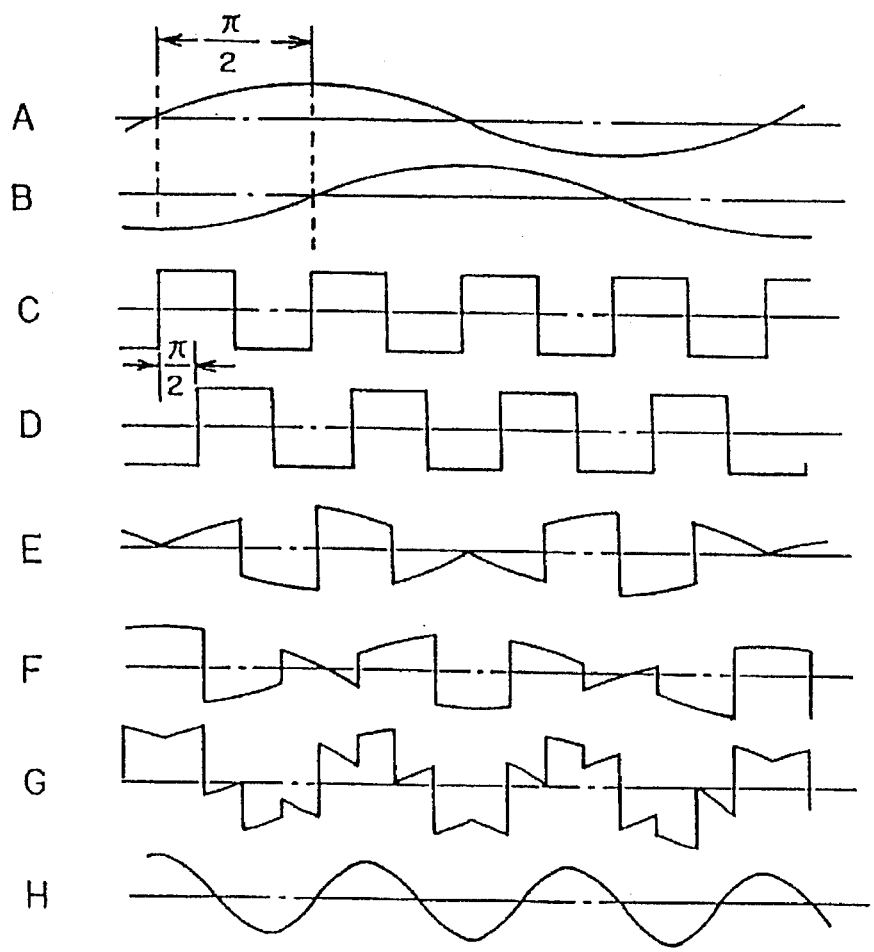
FIG. 12 shows waveforms useful to understand an operation of the conventional circuit shown in FIG. 11.
Figure 13:
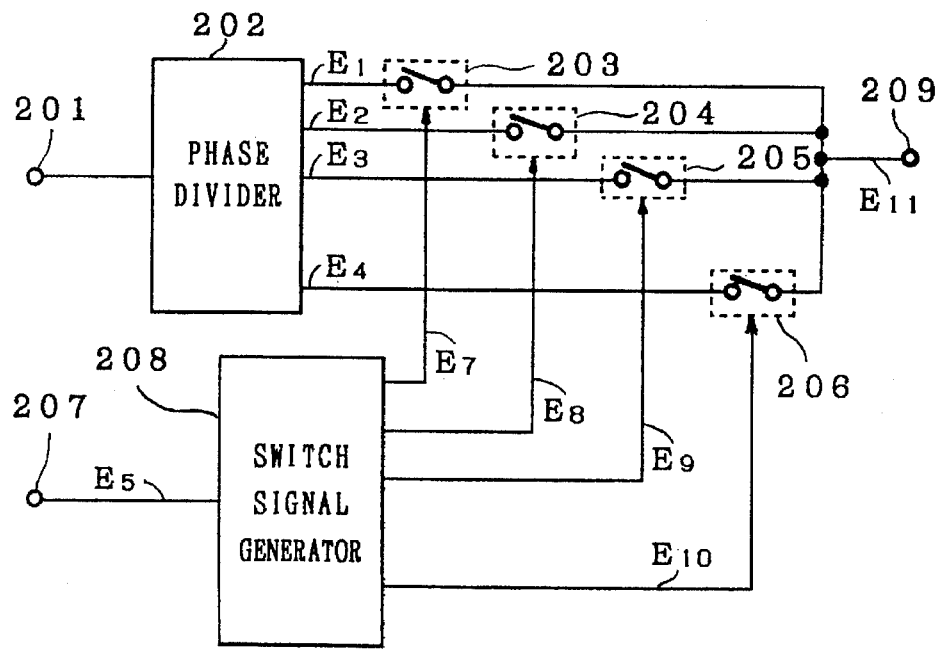
FIG. 13 is a block circuit diagram of a further example of the basic system of a frequency converting circuit according to the present invention.
Figure 14:
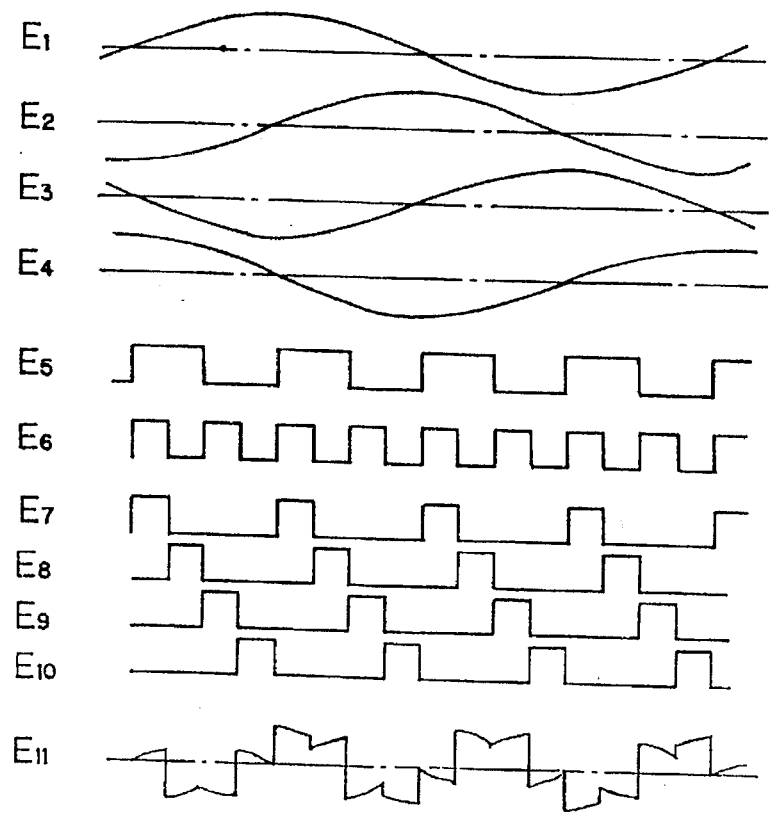
FIG. 14 shows waveforms useful to understand an operation of the circuit shown in FIG. 13.

FIG. 13 is a block circuit diagram showing another example of the basic system of the frequency converting circuit according to the present invention and FIG. 14 shows signal waveforms at various points of the circuit shown in FIG. 13. In this description, it is assumed that the fundamental frequency has the same waveform as that used in the conventional frequency converting circuit shown in FIG. 12.

It is assumed that an input signal E1 (first input signal) is supplied to an input terminal 201. The input signal E1 is then phase-divided (phase-shifted) by a phase dividing circuit 202. In this case, it is assumed that the input signal E1 is phase divided to produce 4 channel signals E1 to E4 as shown in FIG. 14.

It is further assumed that an input signal E5 (second input signal) is inputted to an input terminal 207. In this case, the waveform of the input signal E5 may not always be rectangular. In response to the input signal E5, a switch signal generating circuit 208 generates a signal E6 whose period is a half of that of the input signal E5 and generates switch signals E7, E8, E9 and E10 on the basis of the signal E6 as shown in FIG. 14.

The phase-divided (shifted) signals E1, E2, E3 and E4 are switched by switches 203, 204, 205 and 206 responsive to the switch signals E7, E8, E9 and E10, respectively, resulting in an output signal E11 at an output terminal 209 connected commonly to outputs of the switches 203 to 206. This signal E11 is equivalent to the signal G shown in FIG. 12.

The phase dividing circuit 202 shifts a phase angle of $2\pi$ of the input signal E1 by the number of channels which, in this embodiment, is 4, and outputs four phase divided signals having phases shifted by phase angles of 0, $\pi/2$, $\pi$ and $3\pi/2$ with respect to the input signal E1, that is, E1 having phase shifted by 0 with respect to the input signal E1, E2 having phase shifted by $\pi/2$ with respect to the input signal E1, E3 having phase shifted by with respect to the input signal E1, and E4 having phase shifted by $3\pi/2$ with respect to the input signal E1.

The switch signal generating circuit 208 divides phase angle of $2\pi$ of the input signal E5 by the number of channels which, in this embodiment, is 4, and outputs four phase divided signals having phases shifted by phase angles of 0, $\pi/2$, $\pi$ and $3\pi/2$ with respect to the input signal E5, that is, the switch signal E7 having phase shifted by 0 with respect to the input signal E5, the switch signal E8 having phase shifted by $\pi/2$ with respect to the input signal E5, the switch signal E9 having its phase shifted by $\pi$ with respect to the input signal E5 and the switch signal E10 having its phase shifted by $3\pi/2$ with respect to the input signal E5.

Figure 15:
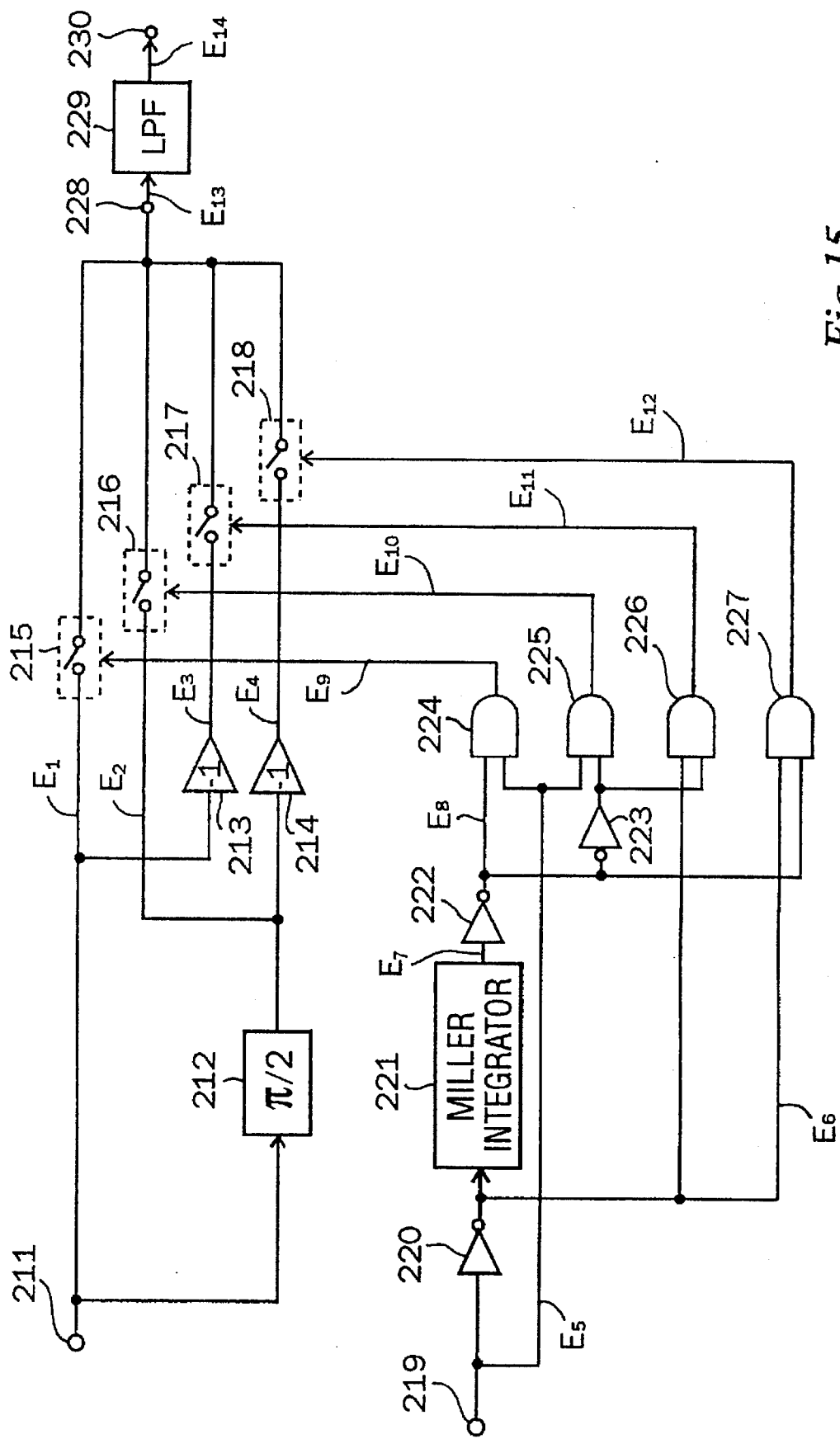
FIG. 15 is a block circuit diagram of a fourth embodiment of a frequency converting circuit according to the present invention.
Figure 16:
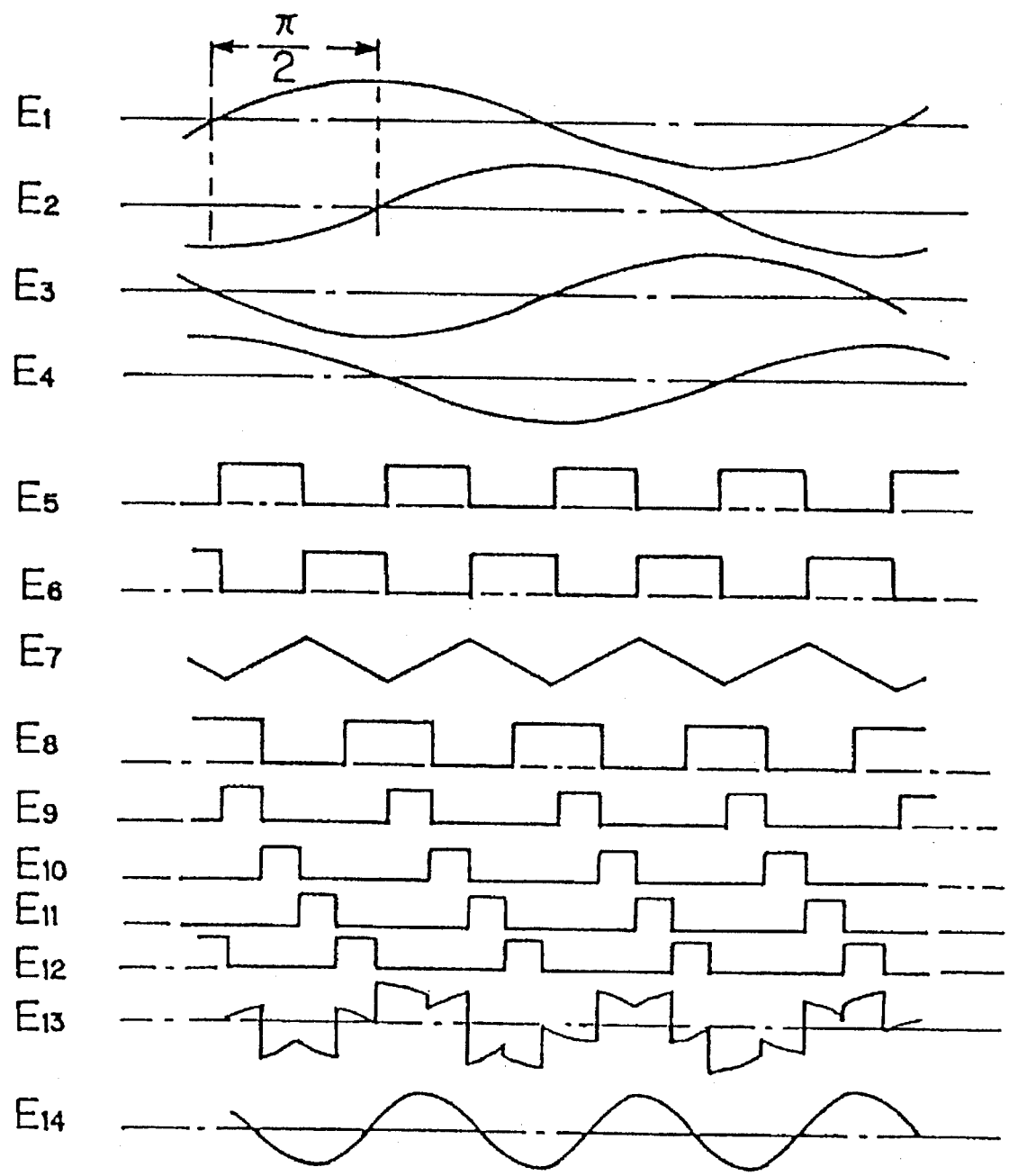
FIG. 16 shows waveforms useful to understand an operation of the circuit shown in FIG. 15.

A fourth embodiment of the present invention will be described with reference to FIG. 15 which is a block circuit diagram of the fourth embodiment and FIG. 16 which shows signal waveforms at various points of the circuit in FIG. 15.

An input signal E1 supplied to an input terminal 211 is supplied to a switch 215, a phase inverter/amplifier 213 having a gain of 1 and a $\pi/2$ phase shifter 212. An output E3 of the phase inverter/amplifier 213, which is the input signal E1 having its phase inverted, is supplied to a switch 217 and an output E2 of the $\pi/2$ phase shifter 212 is supplied to a switch 216 and a phase inverter/amplifier 214 having a gain of 1, and the signal E4 which is the signal E2 having its phase inverted, is supplied to a switch 218.

On the other hand, an input signal E5 supplied to an input terminal 219 is supplied to an inverter 220 and AND gates 224 and 225 and an output signal E6 of the inverter 220 is supplied to a Miller integrator circuit 221 and AND gates 226 and 227. An output signal E7 of the Miller integrator circuit 221 is inverted by an inverter 222 and a resultant signal E8 is supplied to the AND gates 224 and 227 and an inverter 223. An output of the inverter 223 is supplied to the AND gates 225 and 226.

Switch signals E9, E10, E11 and E12 are outputted from the AND gates 224, 225, 226 and 227 to the switches 215, 216, 217 and 218, respectively. Thus, the signals E1, E2, E3 and E4 are switched responsive to the switch signals E9 to E12, resulting in an output signal E13 at a switch output terminal 228. The output signal E13 is passed through a simple low-pass filter (LPF) 229 and a signal E14 which is frequency converted and has substantially ideal waveform is obtained at an output terminal 230.

In the frequency converting circuit of the present invention, it is possible to smooth a waveform of the frequency converted output signal even when such low-pass filter is not used. A fifth embodiment of the present invention does not require such low-pass filter for smoothing the output signal waveform.

Figure 17:
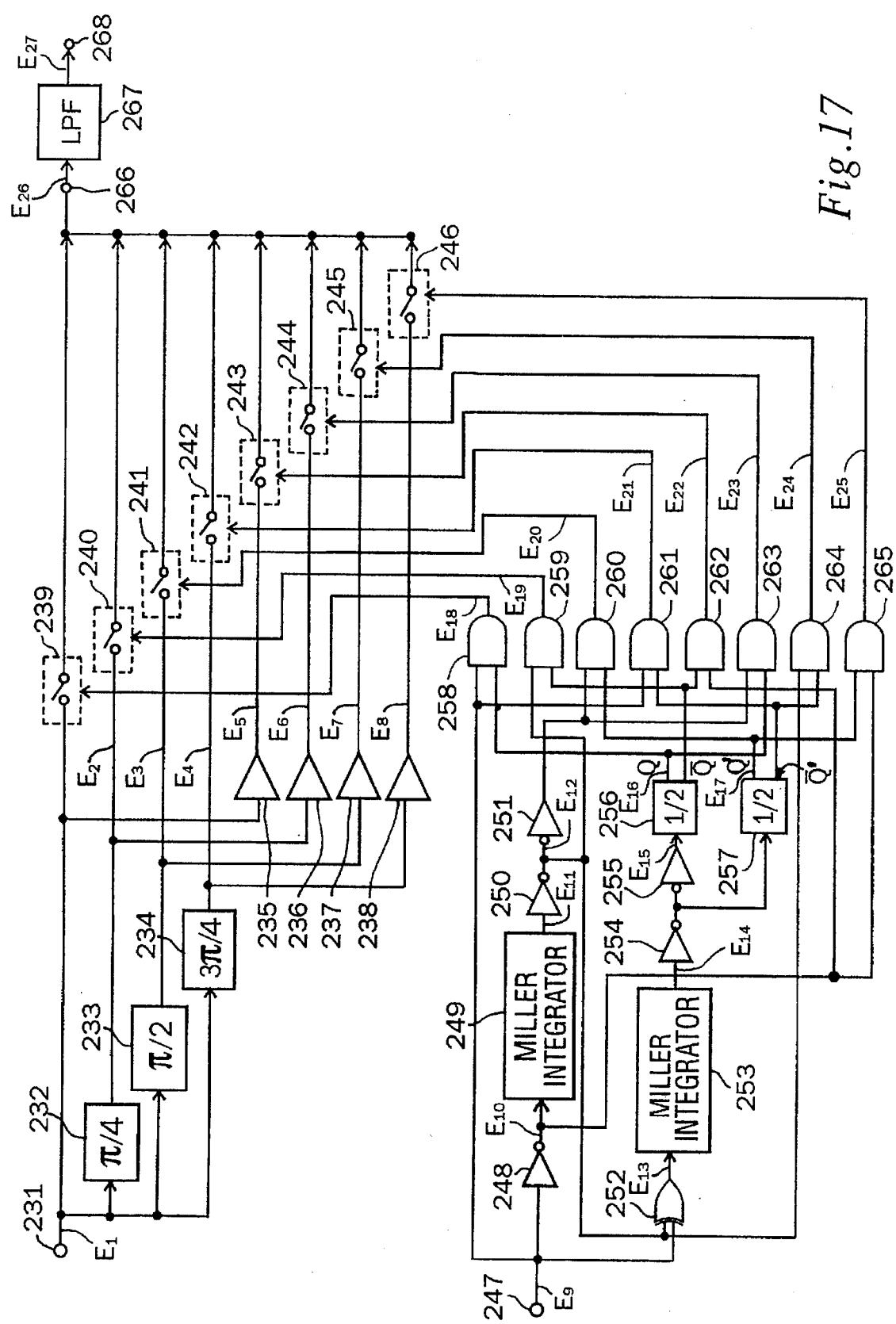
FIG. 17 is a block circuit diagram of a fifth embodiment of a frequency converting circuit according to the present invention.
Figure 18:
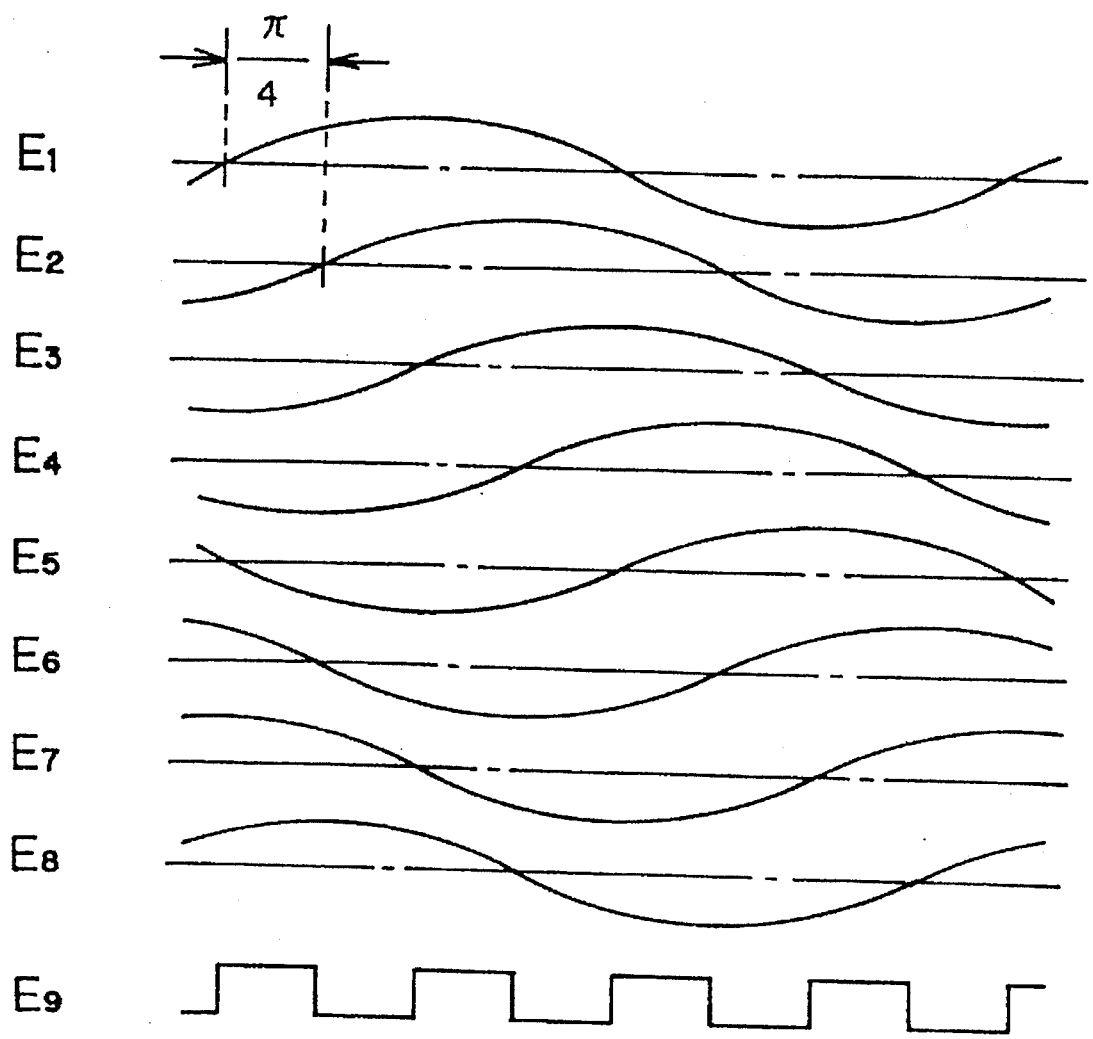
FIGS. 18 and 19 show waveforms useful to understand an operation of the circuit shown in FIG. 17.
Figure 19:
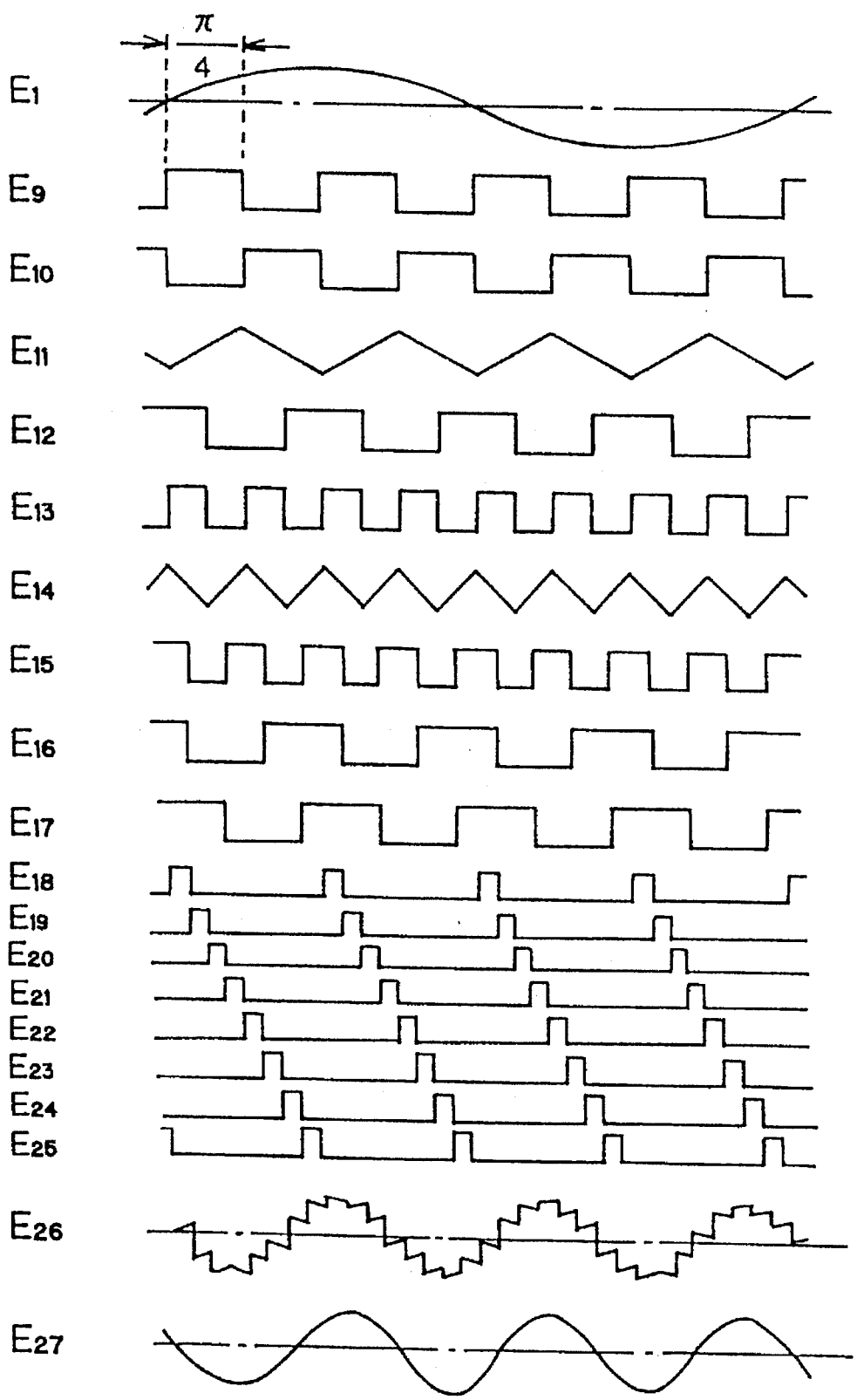

FIG. 17 is a block circuit diagram of the fifth embodiment of the frequency converting circuit according to the present invention and FIGS. 18 and 19 show signal waveforms at various points in the circuit.

An input signal E1 supplied to an input terminal 231 is fed to a switch 239, phase shifters 232, 233 and 234 for shifting a phase by $\pi/4$, $\pi/2$ and $3\pi/4$, respectively, and to a phase inverter/amplifier 235 having gain of 1. Outputs E2, E3 and E4 of the phase shifters 232, 233 and 234 are supplied to switches 240, 241 and 242, respectively, and phase inverter/amplifiers 236, 237 and 238, respectively. Outputs E5, E6, E7 and E8 of the phase inverter/amplifiers 235, 236, 237 and 238 are supplied to switches 243, 244, 245 and 246, respectively.

On the other hand, an input signal E9 supplied to an input terminal 247 is supplied to an inverter 248, AND gates 258 and 261 and an EX-OR gate 252, and an output signal E10 of the inverter 248 is supplied to a Miller integrator circuit 249 and AND gates 262 and 265. An output signal E11 of the Miller integrator circuit 249 is inverted by an inverter 250 and a resultant signal E12 is supplied to AND gates 259 and 264, the EX-OR gate 252 and an inverter 251. An output of the inverter 251 is supplied to AND gates 260 and 263.

An output signal E13 of the EX-OR gate 252 is supplied to a Miller integrator circuit 253 whose output signal E14 is supplied to an inverter 254, and an output thereof is fed to an inverter 255 and a ½ frequency divider 257. An output signal E15 of the inverter 255 is supplied to a ½ frequency divider 256. The ½ frequency divider 256 outputs a signal E16 (output Q in FIG. 17) and a signal (output $\overline{Q}$) which is the signal E16 having its phase inverted. The output signal E16 is supplied to AND gates 258 and 263 and the phase inverted signal $\overline{Q}$ is supplied to AND gates 259 and 262. The ½ frequency divider 257 outputs a signal E17 (output Q' in FIG. 17) and a signal (output $\overline{Q}'$) which is the signal E17 having its phase inverted. The output signal E17 is supplied to AND gates 260 and 265 and the phase inverted signal $\overline{Q}'$ is supplied to AND gates 261 and 264.

Switch signals E18, E19, E20, E21, E22, E23, E24 and E25 are outputted from the AND gates 258, 259, 260, 261, 262, 263, 264 and 265 and supplied to the switches 239, 240, 241, 242, 243, 244, 245 and 246, respectively. Thus, the signals E1 to E8 are switched responsive to the respective switch signals E18 to E25, resulting in an output signal E26 at a switch output terminal 266. The output signal E26 is passed through a simple low-pass filter (LPF) 267 and a signal E27 which is obtained at an output terminal 268.

The number of channels of the circuit shown in FIG. 17 is 8 and, therefore, the waveform of the frequency converted output signal E26 is finer as shown in FIG. 19. Therefore, strict characteristics of the low-pass filter 267 is not always required.

The frequency converting circuit according to the present invention can output a sum of a first and second frequency input signals by reversing the order of the signals to be supplied to the respective switches. In the circuit shown in FIG. 15, for example, it may be possible to reverse the order of the signals E1 to E4, that is, to supply the signals E4 to E1 to the respective switches 215 to 218, while the order of the signals E9 to E12 is maintained unchanged. Alternatively, it may be possible to reverse the order of the signals E9 to E12 while the order of the signals E1 to E4 is maintained unchanged.

As described in detail, the frequency converting circuit according to the present invention does not have the problems of unbalance of the balanced modulator and unbalance of mixing in the adder/subtracter circuit of the conventional circuit, basically. Further, the phase division circuit of the present frequency converting circuit can use, for example, Hilbert transformation by which a phase is shifted independently from frequency, and the switch signal generating circuit thereof can use a Miller integrator circuit, etc. Therefore, the frequency converting circuit of the present invention can operate stably even if frequencies of the input signals vary or the frequencies thereof are changed intentionally. That is, the frequency converting circuit of the present invention does not require balance adjustments and can be used in a wide frequency range from low frequency to high frequency. Therefore, the frequency inverter circuit of the present invention is suitable to be incorporated in an integrated circuit based on the phase shifting type single sideband signal generation without requiring any adjustments.

Consequently, the frequency converting circuit of the present invention can be used in the well known frequency inverting scrambler circuit or single side band modulators (SSB modulator).

What is claimed is:

1. A frequency converting circuit for generating one of a sum and a difference of frequencies of a first input signal and a second input signal, comprising:

phase division means for outputting a plurality of channel signals having different phases from each other by dividing a phase of the first input signal into a plurality of different phases;

switch signal generating means for generating from said second input signal, a plurality of different switch signals which correspond in number to a number of the plurality of channel signals, the plurality of different switch signals having different phases from each other; and switch means including a plurality of switches corresponding in number to the number of the plurality of channel signals, said plurality of switches being respectively supplied with said plurality of channel signals, and being respectively supplied with said plurality of different switch signals, said plurality of switches being activated by responding respectively to said plurality of different switch signals so as to pass said plurality of channel signals to an output terminal of said frequency converting circuit.

2. The frequency converting circuit as claimed in claim 1, wherein said switch signal generating means includes a Miller integration circuit and gate circuits.

3. The frequency converting circuit as claimed in claim 1, wherein said switch signal generating means comprises a Miller integrator circuit and gate devices and generates the plurality of switch signals.

4. The frequency converting circuit as claimed in claim 1, wherein said phase division means divides the phase $2\pi$ of the first input signal by $2^n$ to produce $2^n$ units of said different channel signals where "n" is a natural number at least equal to 2, and wherein said switch signal generating means divides the phase $2\pi$ of the second input signal by $2^n$ to produce $2^n$ units of said different switch signals.

5. The frequency converting circuit as claimed in claim 4, wherein said switch signal generating means includes a Miller integration circuit and gate circuits.

6. A frequency converting circuit for converting a frequency of a first signal into another frequency in response to a second input signal, comprising:

phase division means for outputting a plurality of channel signals having different phases from each other by shifting a phase of the first input signal;

switch signal generating means for generating a plurality of switch signals from the second input signal, a number of the switch signals corresponding to a number of the channel signals;

first switch means including a plurality of switches arranged in a column, each of the plurality of switches selectively outputting at least one of two signals of the plurality of the channel signals, in response to a respective one of said plurality of the switch signals; and second switch means for selectively outputting one of an output signal of said first switch means and a signal obtained by inverting the output signal of said switch means in response to another respective one of said plurality of switch signals.

7. The frequency converting circuit as claimed in claim 6, wherein said switch signal generating means comprises a Miller integrator circuit and gate devices and generates the plurality of the switch signals.

8. A frequency converting circuit for generating one of a sum and a difference of frequencies of a first input signal and a second input signal, comprising:

phase division means for outputting $2^n$ units of channel signals having different phases from each other by shifting a phase of the first input signal into different angles, each of the different angles being within $\pi$ radian, where "n" is a natural number;

switch signal generating means for generating "k" units of switch signals having frequencies of $2^m$ times a fundamental frequency of the second input signal, where m=0 to k, and k is an integer and no more than "n";

first switch means for switching said $2^n$ units of channel signals responsive to "k−1" units of a respective one of said switch signals and producing a first output and a second output, said second output being a phase-inverted signal of said first output; and second switch means for selectively outputting one of said first and second outputs of said first switch means responsive to that one of said "k" units of switch signals having a same fundamental frequency as the second input signal.

9. The frequency converting circuit as claimed in claim 8, wherein said phase division means outputs said $2^n$ units of channel signals having different phases from each other by shifting the phase of the first input signal into different angles, each of the different angles being a natural number multiple of $\pi/2^n$ radian.

10. The frequency converting circuit as claimed in claim 8, wherein said first switch means comprises $2^{n-1}$ units of switches arranged in a column as one group, and $2^{n-2}$ units of additional switches arranged in an additional column as an additional group where "n" is at least 2, and said one group of switches, and said additional group of additional switches are connected in tandem.

11. The frequency converting circuit as claimed in claim 8, wherein said switch signal generating means comprises a Miller integrator circuit and gate devices and generates the plurality of the switch signals.

12. A frequency converting circuit for converting a frequency of a first input signal into another frequency in response to a second input signal, comprising:

phase division means for outputting a plurality of channel signals having different phases from each other by shifting a phase of the first input signal;

switch signal generating means for generating a plurality of switch signals from the second input signal, the plurality of switch signals corresponding in number to a number of the plurality of channel signals;

first switch means for selectively outputting one of the plurality of the channel signals in response to a respective one of the plurality of the switch signals; and second switch means for selectively outputting said one said selected output signal of said first switch means or a signal obtained by inverting a phase of said one selected output signal of said first switch means in response to the respective one of the plurality of the switch signals.

13. The frequency converting circuit as claimed in claim 12, wherein said switch signal generating means comprises a Miller integrator circuit and gate devices and generates the plurality of the switch signals.

14. A frequency converting circuit for converting a frequency of a first input signal into another frequency in response to a second input signal, comprising:

phase division means for outputting N channel signals having different phases from each other by shifting a phase of the first input signal into different angles, each of the different angles being within $\pi$ radian, where N is a natural number equal to at least 2;

switch signal generating means for dividing the phase $\pi$ of the second input signal by N and for generating N switch signals having different phases from each other, each of the N switch signals having a period equal to ½ of a period of the second input signal;

first switch means including N switches having outputs connected commonly, each of said N switches selectively outputting one of the channel signals, to said common output in response to a respective one of the plurality of the different switch signals; and second switch means for selectively outputting the common output signal of said first switch means or a signal obtained by inverting a phase of the common output signal of said first switch means in response to another switch signal having a same fundamental frequency as the second input signal.

15. The frequency converting circuit as claimed in claim 14, wherein said phase division means outputs N channel signals having different phases from each other by shifting the phase of the first input signal into different angles, each of the different angles being a natural number multiple of $\pi/N$ radian, where N is an even integer equal to at least 2, and wherein said switch signal generating means equally divides the phase $\pi$ of the second input signal by N and generates N switch signals having different phases from each other, each having a period equal to ½ of a period of the second input signal.

16. The frequency converting circuit as claimed in claim 14, wherein said switch signal generating means comprises a Miller integrator circuit and gate devices and generates the plurality of the switch signals.

* * * * *